US010289173B2

(12) United States Patent
Szeremeta et al.

(10) Patent No.: US 10,289,173 B2
(45) Date of Patent: May 14, 2019

(54) STORAGE DRIVE HEAT SINK MOUNTING STRUCTURE

(71) Applicant: Western Digital Technologies, Inc., Irvine, CA (US)

(72) Inventors: Wojciech Szeremeta, Mission Viejo, CA (US); Ken Nguyen, Huntingdon Beach, CA (US); Kam Cheong Chin, Irvine, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/456,267

(22) Filed: Mar. 10, 2017

(65) Prior Publication Data

US 2017/0185117 A1    Jun. 29, 2017

Related U.S. Application Data

(63) Continuation of application No. 14/661,952, filed on Mar. 18, 2015, now Pat. No. 9,594,409.

(51) Int. Cl.
| | |
|---|---|
| *H01L 23/467* | (2006.01) |
| *G11B 33/12* | (2006.01) |
| *G06F 1/20* | (2006.01) |
| *G06F 1/18* | (2006.01) |
| *G11B 33/14* | (2006.01) |
| *G11B 25/04* | (2006.01) |
| *G11B 33/02* | (2006.01) |
| *H05K 7/20* | (2006.01) |

(52) U.S. Cl.
CPC ............. *G06F 1/20* (2013.01); *G06F 1/187* (2013.01); *G11B 25/043* (2013.01); *G11B 33/02* (2013.01); *G11B 33/025* (2013.01); *G11B 33/123* (2013.01); *G11B 33/124* (2013.01); *G11B 33/142* (2013.01); *G11B 33/1406* (2013.01); *G11B 33/1426* (2013.01); *H01L 23/467* (2013.01); *H05K 7/2039* (2013.01)

(58) Field of Classification Search
CPC ......... H01L 23/367; H01L 2224/48137; H01L 23/467; H01L 27/14601; H01L 23/4006; G06F 1/187; G06F 1/206; G11B 33/08; G11B 33/128; G11B 33/1426; G11B 33/142; G11B 33/144; G11B 33/1406; G11B 33/124; G11B 33/14; G11B 33/022; G11B 33/1413
See application file for complete search history.

(56) References Cited

U.S. PATENT DOCUMENTS

| | | | | |
|---|---|---|---|---|
| 5,510,954 | A | * 4/1996 | Wyler | ........ G06F 1/18 360/99.25 |
| 5,777,845 | A | 7/1998 | Krum et al. | |
| 6,002,588 | A | 12/1999 | Vos et al. | |
| 6,084,768 | A | * 7/2000 | Bolognia | ........ G06F 1/184 248/636 |

(Continued)

*Primary Examiner* — Adam B Dravininkas
(74) *Attorney, Agent, or Firm* — Knobbe, Martens, Olson & Bear, LLP

(57) ABSTRACT

A heat sink can be used as part of a storage drive to perform multiple functions, both structural and thermodynamic. It can be used as a heat dissipating element and it can be used as the key mechanical mounting structure for storage drives, such as hard disk drives (HDD), and any circuit boards.

25 Claims, 8 Drawing Sheets

(56) References Cited

U.S. PATENT DOCUMENTS

| | | | |
|---|---|---|---|
| 6,141,211 A | 10/2000 | Strickler et al. | |
| 6,434,000 B1* | 8/2002 | Pandolfi | F25B 21/02 |
| | | | 136/204 |
| 7,388,749 B1 | 6/2008 | Feroli et al. | |
| 7,701,705 B1 | 4/2010 | Szeremeta | |
| 8,064,194 B2 | 11/2011 | Szeremeta | |
| 8,113,873 B1 | 2/2012 | Sarraf | |
| 8,133,426 B1 | 3/2012 | Yurchenco et al. | |
| 8,358,395 B1 | 1/2013 | Szeremeta | |
| 8,417,979 B2 | 4/2013 | Maroney | |
| 8,462,460 B1 | 6/2013 | Szeremeta et al. | |
| 8,498,088 B1 | 7/2013 | Klein | |
| 8,547,658 B1 | 10/2013 | Szeremeta | |
| 8,919,895 B2* | 12/2014 | Lin | G11B 33/124 |
| | | | 312/223.2 |
| 9,594,409 B1 | 3/2017 | Szeremeta et al. | |
| 2001/0024357 A1* | 9/2001 | Behl | G06F 1/20 |
| | | | 361/679.37 |
| 2003/0193778 A1* | 10/2003 | Staiano | G11B 33/08 |
| | | | 361/679.34 |
| 2004/0085722 A1 | 5/2004 | Tanzer et al. | |
| 2004/0150947 A1* | 8/2004 | Tang | G11B 15/682 |
| | | | 361/679.34 |
| 2004/0174673 A1* | 9/2004 | Lin | G06F 1/184 |
| | | | 361/679.54 |
| 2004/0207980 A1 | 10/2004 | Kobayashi | |
| 2005/0264995 A1 | 12/2005 | Hanson | |
| 2009/0180251 A1* | 7/2009 | Biagini | H05K 7/20918 |
| | | | 361/690 |
| 2009/0292852 A1 | 11/2009 | Justice et al. | |
| 2011/0043992 A1* | 2/2011 | Peng | A47B 81/068 |
| | | | 361/679.31 |
| 2011/0075367 A1* | 3/2011 | Campbell | H05K 7/20772 |
| | | | 361/699 |

* cited by examiner

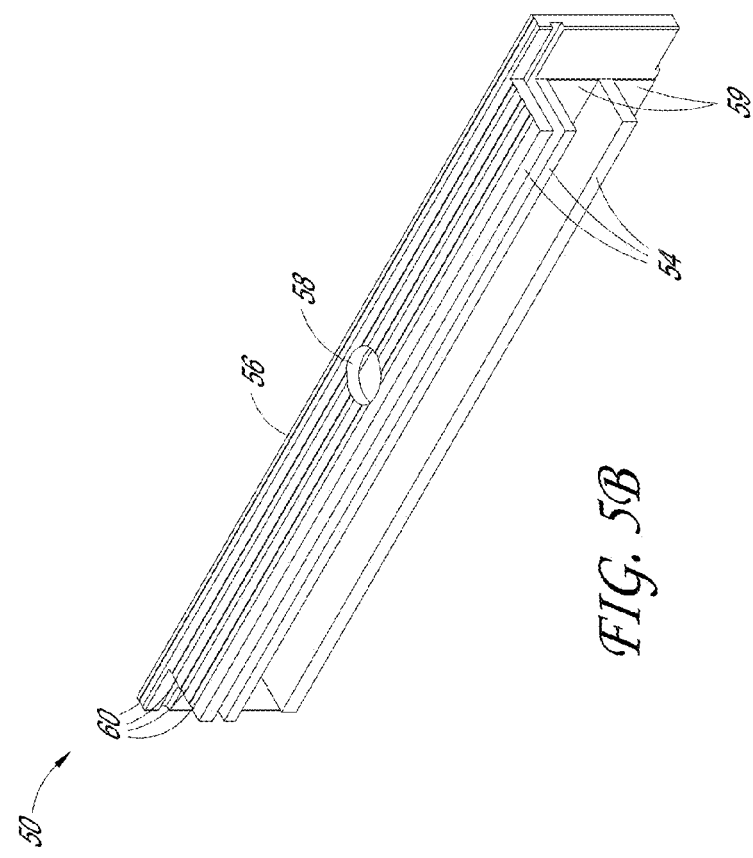
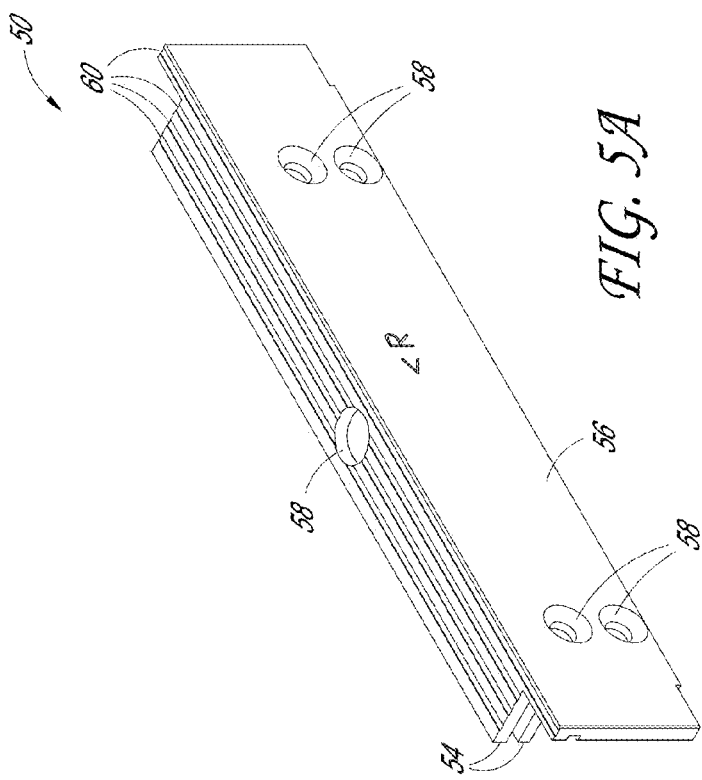
FIG. 5A
FIG. 5B

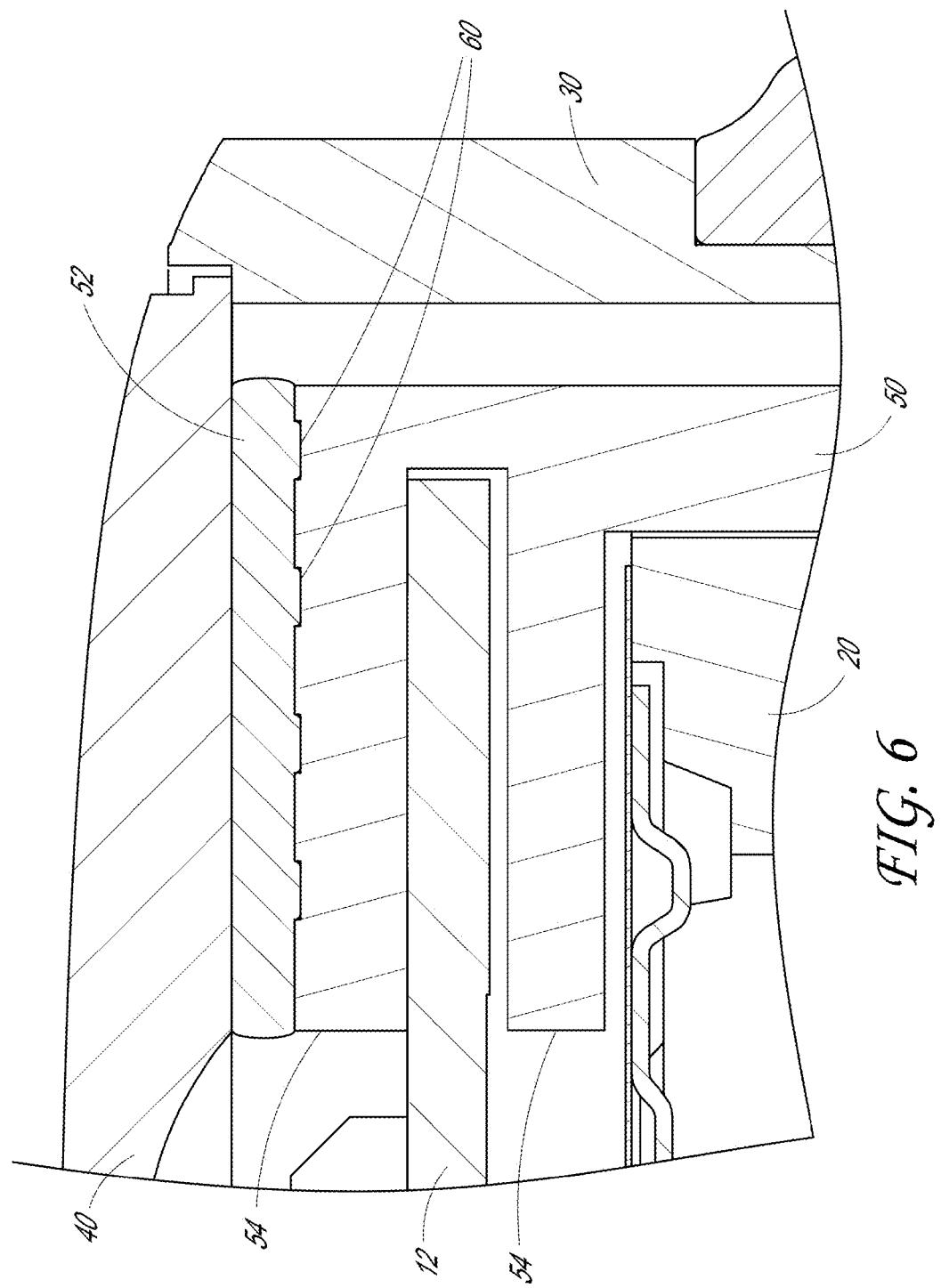

STORAGE DRIVE HEAT SINK MOUNTING STRUCTURE

CROSS-REFERENCE TO RELATED APPLICATIONS

This application is a continuation of U.S. application Ser. No. 14/661,952, filed Mar. 18, 2015, titled "STORAGE DRIVE HEAT SINK MOUNTING STRUCTURE", which is incorporated herein in its entirety by reference.

BACKGROUND

A hard disk drive (HDD) is a storage drive used for storing and retrieving digital information. A HDD generally has one or more rapidly rotating disks with a magnetic head arranged on a moving actuator arm to read and write data to the disk surface. A typical disk is spun at speeds varying anywhere from 4,200 rpm in energy-efficient portable devices, to 15,000 rpm for high performance servers. Other disks may spin at 1,200 rpm, 3,600 rpm, or in the range of 5,400 rpm to 7,200 rpm, though any range of speeds could be used.

Due to the extremely close spacing between the magnetic head and the spinning disk surface, HDDs are vulnerable to being damaged by a head crash—a failure of the disk in which the head scrapes across the platter surface, often grinding away the thin magnetic film and causing data loss. Head crashes can be caused by, among other things, electronic failure, a sudden power failure, physical shock, contamination of the drive's internal enclosure, wear and tear, corrosion, or poorly manufactured disks and heads. In addition, the high speed disks can generate large amounts of heat that needs to be dissipated.

BRIEF DESCRIPTION OF THE DRAWINGS

Various embodiments are depicted in the accompanying drawings for illustrative purposes, and should in no way be interpreted as limiting the scope of the inventions.

FIGS. 5A and 5B show perspective views of a heat sink.

FIG. 6 is a detail cross-sectional view of a storage drive.

DETAILED DESCRIPTION

One way to protect a HDD from a head crash is to provide protection from physical shock. For example, the hard drive may be isolated from an enclosure and/or other components by shock mounts that are positioned between the hard drive and the enclosure. Shock mounts are often attached directly to the hard drive and the hard drive is effectively suspended within the enclosure by way of the shock mounts. Further, fans are often used to cool the device. These fans are often one of the largest consumers of power in the device.

Figure 1:
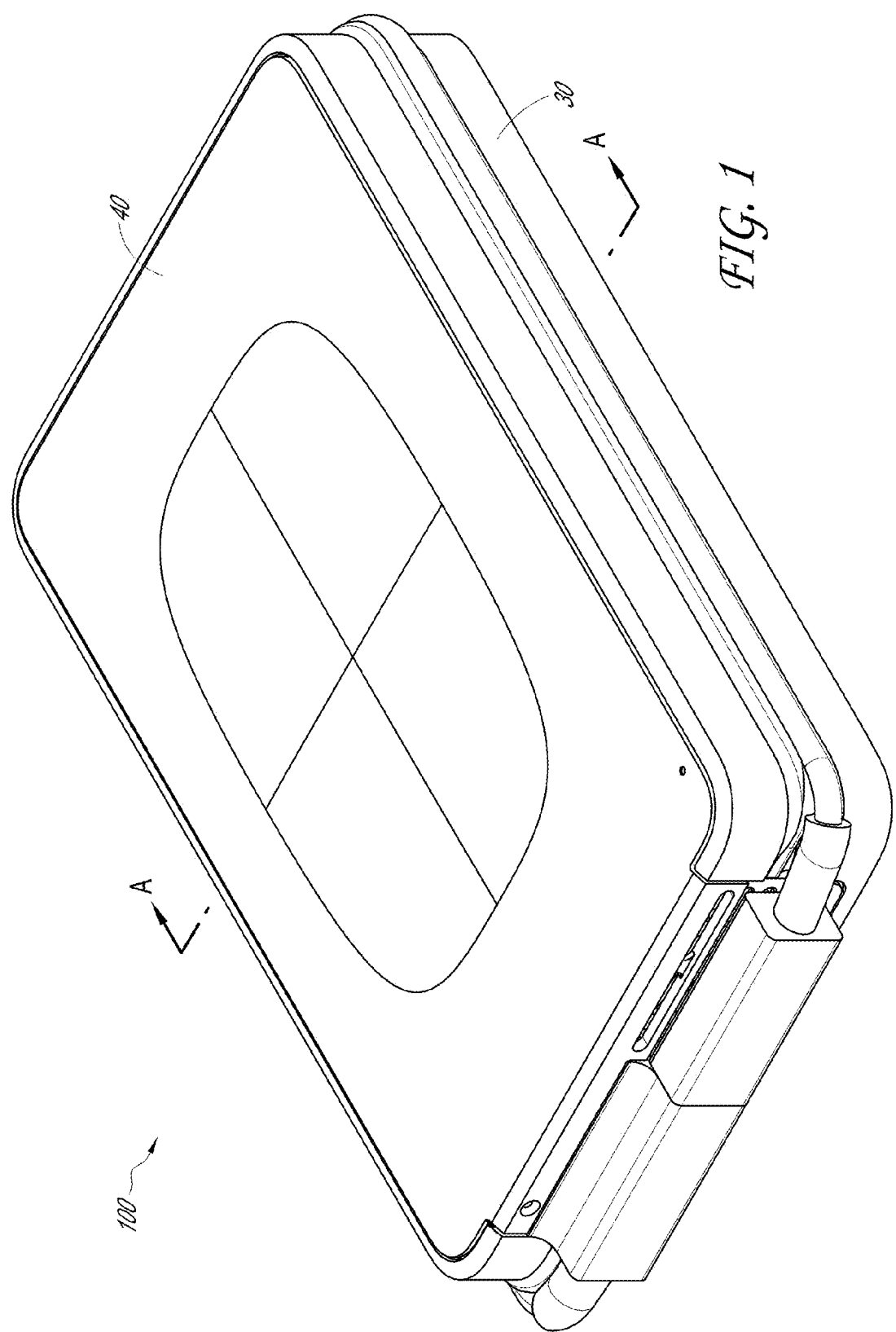
FIG. 1 shows a storage drive.

A storage drive 100 is illustrated in FIG. 1. The storage drive 100 can provide digital storage through a physical drive, such as a hard disk drive (HDD) 20. A drive mounting system 10 (FIG. 2) that can provide heat dissipation and/or shock absorption in a storage drive will now be described. As can also be seen, the drive mounting system 10 can provide a space efficient mounting system for a space efficient enclosure of the storage drive. It will be understood that the concepts described herein can be employed for other uses and with other devices, including, but not limited to, other types of storage drives, whether internal or external, computers, and all types of sensitive electronic devices. For example, the shock absorbing system may also be used with solid-state drives (SSD) and solid-state hybrid drives (SSHD).

A drive mounting system 10 can utilize one or more multipurpose heat sinks 50 as a mounting structure with provision to adapt shock mounts. Further the drive mounting system 10 can provide a passively or semi-passively cooled enclosure for a storage device. For example, the drive mounting system 10 can provide a semi-passively cooled enclosure for a Nano-RAID external storage device, especially a THUNDERBOLT Nano-RAID device.

RAID devices are typically used to provide redundant storage for sensitive data. Conventional RAID devices are powered by a wall outlet, and in many instances, a battery backup. Unfortunately, this limits conventional RAID devices from a wide variety of applications and use cases, such as mobile uses, and field applications.

Typically, bus powered devices have strict power budgets due to the limitations of the power signal that can be delivered over a bus interface, such as a USB or THUNDERBOLT interface. One of the largest consumers of power is a fan to cool the device. A drive mounting system 10 can be used to provide a passively or semi-passively cooled system. In some embodiments, a drive mounting system 10 can be part of a Nano-RAID enclosure with natural convection cooling and shock/vibration isolation, among other things.

Figure 2:
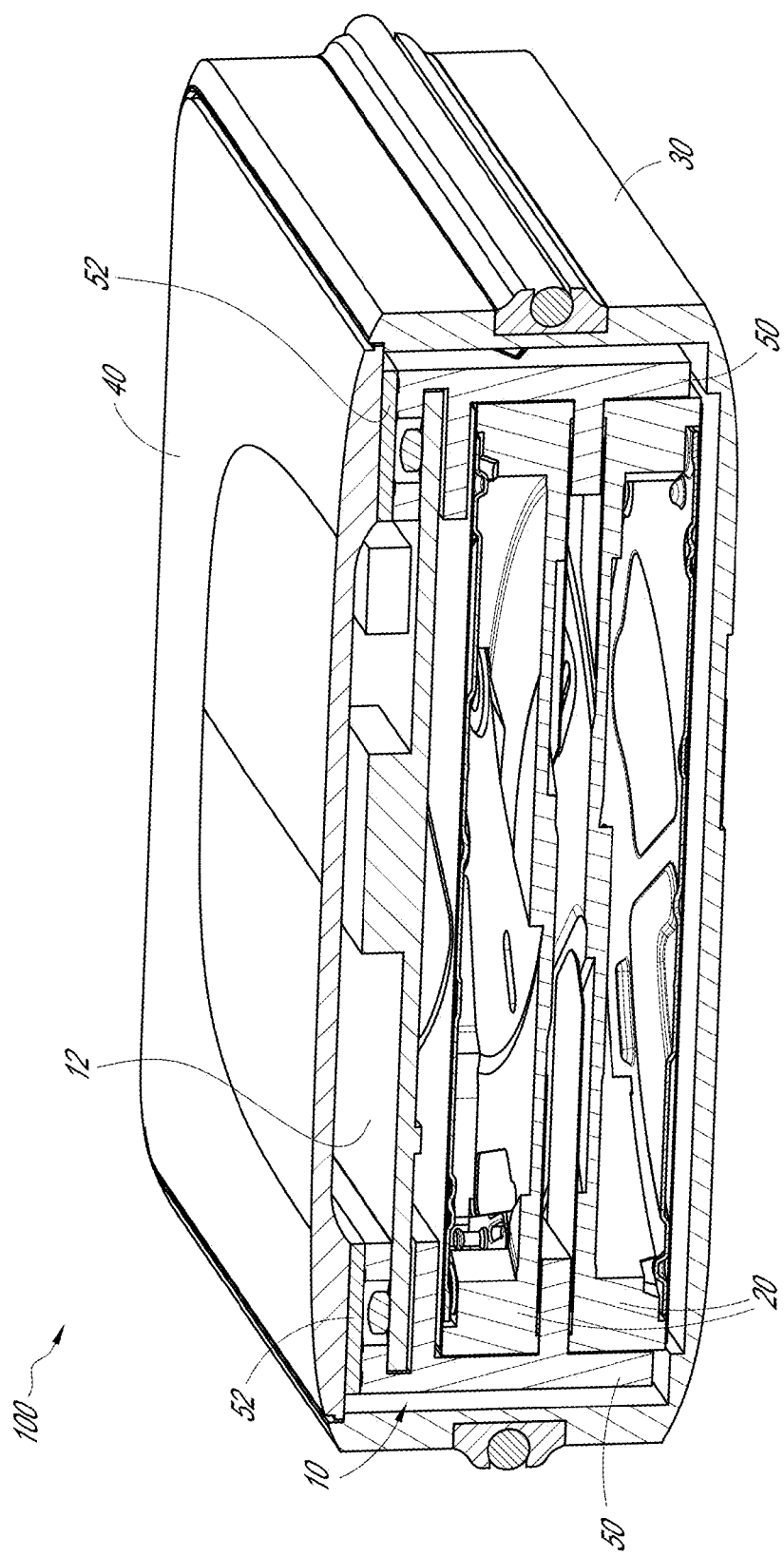
FIG. 2 is a cross-sectional view of the storage drive taken along line A-A of FIG. 1.
Figure 3:
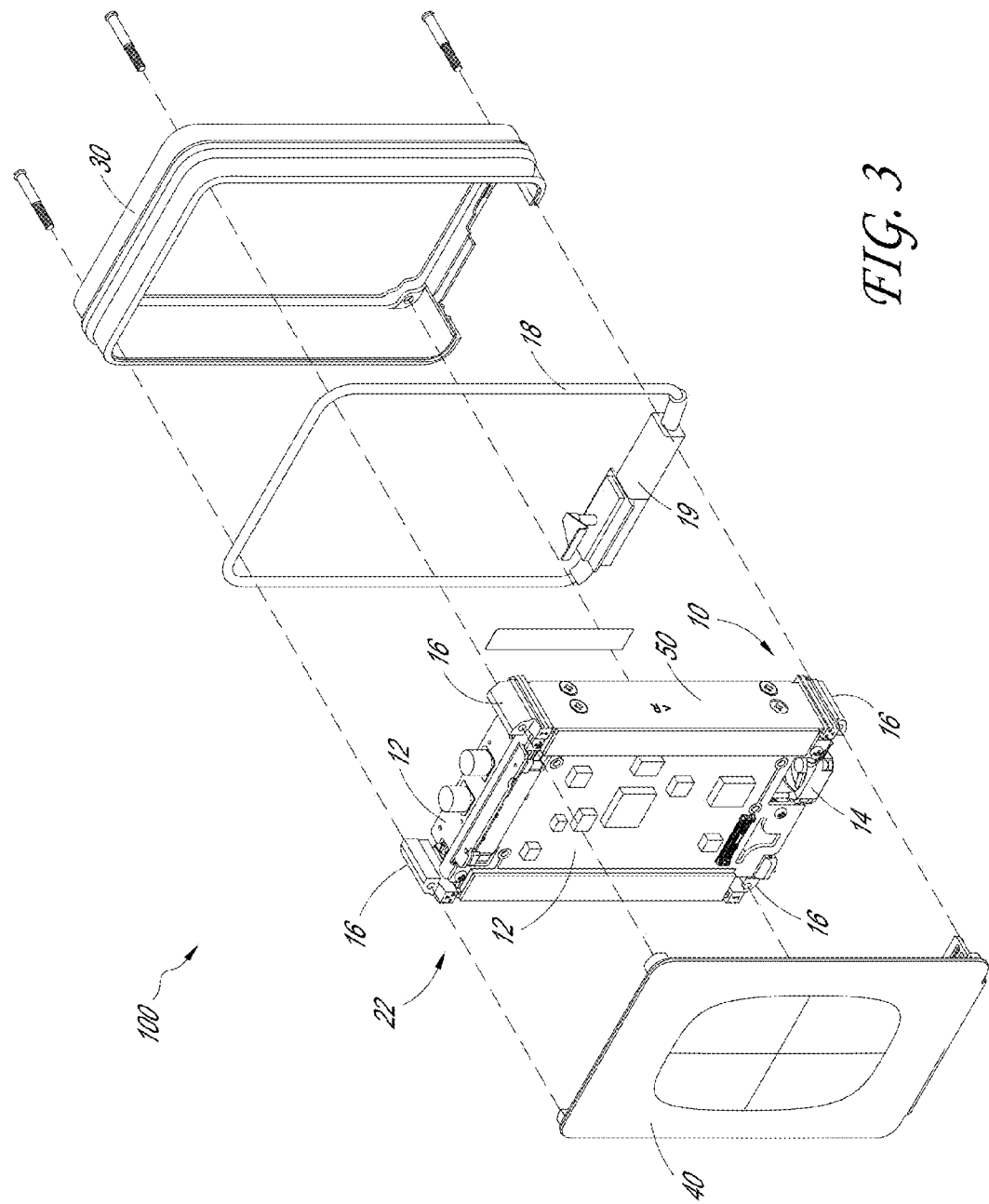
FIG. 3 is a partially exploded view of the storage drive.

Turning now to FIGS. 1-3, some of the features of the illustrated storage drive 100 will be described. The storage drive 100 is shown with first 30 and second 40 mating members that combine to form an enclosure. FIGS. 1 and 3 show the storage drive 100 in an assembled and unassembled condition, respectively. One or more hard disk drives (HDD) 20 can be positioned within the enclosure (FIG. 2), as can one or more printed circuit boards (PCB) 12. The cross section of FIG. 2 shows two HDDs within the enclosure. One or more fans 14 (FIG. 3) may also be included, as can a number of shock absorbers 16.

An electrical connector 18 is also illustrated as part of the storage drive 100. The electrical connector 18 can be any number of different connector types such as USB, THUNDERBOLT, optical, serial, parallel, FIREWIRE, etc. The illustrated connector is a compact design that allows the cable to wrap around the enclosure (first mating member 30) with the connector end 19 connecting to and being stored within another part of the electrical connector 18.

One or more heat sinks 50 can be used as a frame or mounting structure for mounting one or more storage drives 20 within the enclosure as best seen in FIG. 2. The heat sinks and drives can form a subassembly 22 (FIG. 3). The subassembly 22 can be suspended within the enclosure by one or more shock absorbers 16. As will be understood in FIG. 3, screws can pass through the first mating member 30 of the enclosure, the shock absorbers 16 and then threadingly engage the second mating member 40. Other attachment methods can also be used.

Figure 4:
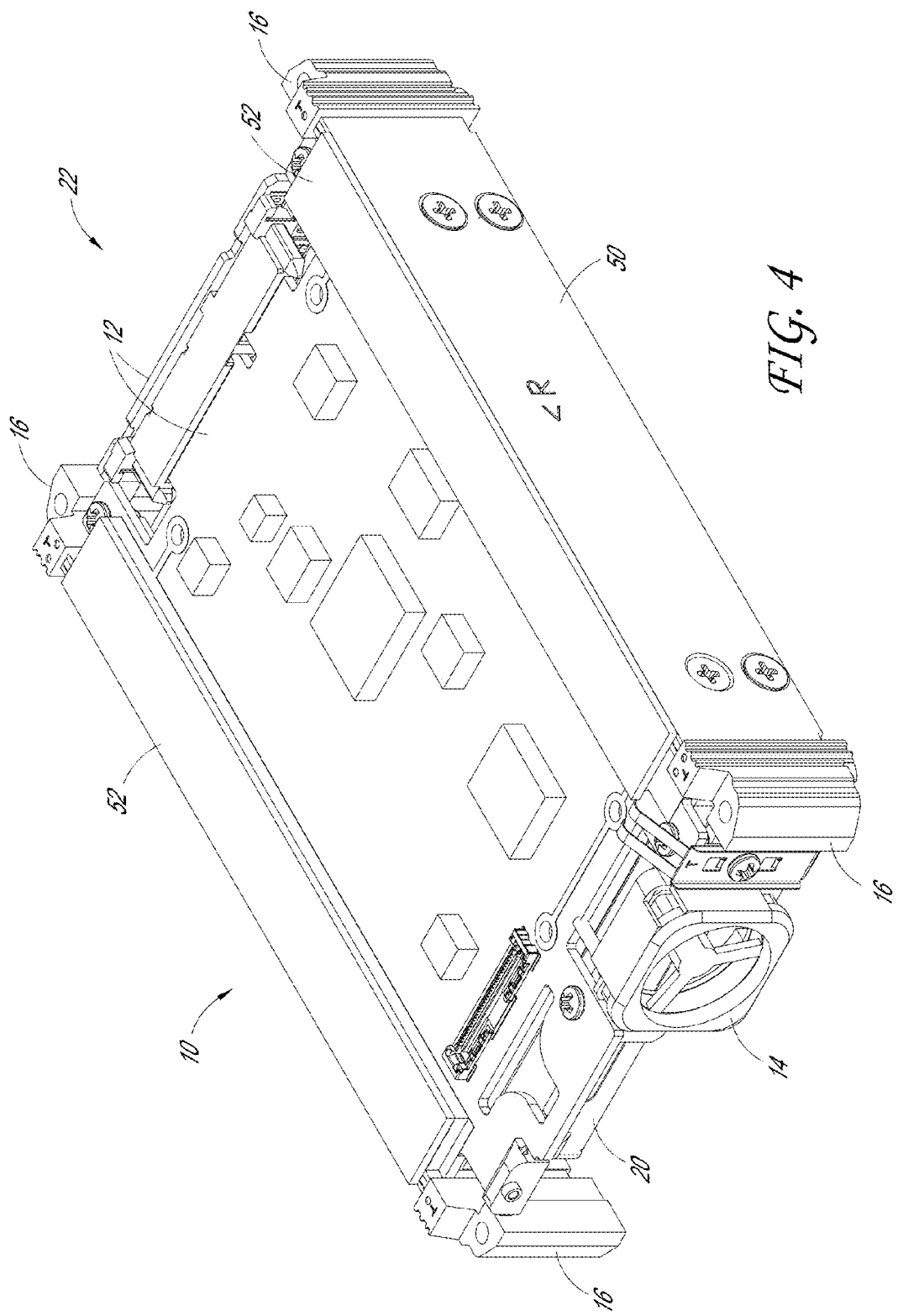
FIG. 4 shows a subassembly of the storage drive with drive mounting system.
Figure 4A:
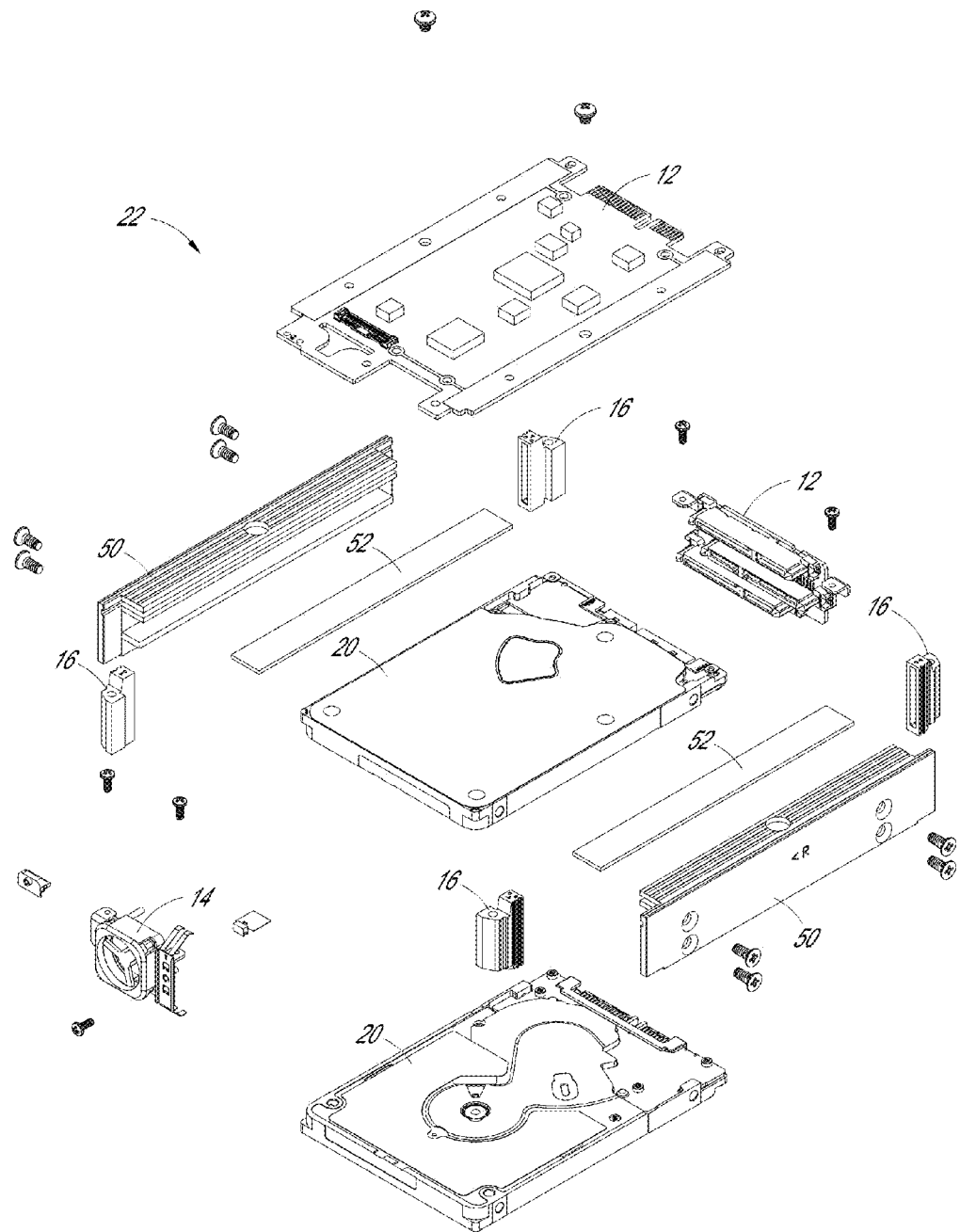
FIG. 4A illustrates an exploded view of the subassembly of FIG. 4.

Looking now to FIGS. 4-4A, the subassembly 22 of the storage drive with a drive mounting system 10 is shown in assembled and unassembled conditions respectively. In some embodiments, a drive mounting system 10 can include one or more heat sinks and one or more disk drives or other types of drives. In the illustrated embodiment, the storage drive has a drive mounting system 10 with two heat sinks 50 and two HDDs 20. In another embodiment, a single heat sink can be used with two or more HDDs. The various embodiments of drive mounting system 10 may also include one or more shock absorbers 16.

As illustrated, four shock absorbers 16 are included, one on each corner of the subassembly 22. The drives 20 are shown directly attached to the heat sinks 50. The shock absorbers 16 are directly connected to the heat sinks. When assembled, the shock absorbers 16 are in contact with the enclosure and suspend both the heat sinks and the drives within the enclosure. A sway space (FIG. 2) can be maintained around the subassembly 22, with the primary exception of the shock absorbers, such that the heat sinks and drives are not in contact with the enclosure. The sway space can also help minimize the possibility of the heat sinks and drives contacting the enclosure during an impact or other shock.

In some embodiments that shock absorbers 16 can slide on to heat sinks 50. The shock absorbers can be rubberized or elastic end caps to the heat sink 50. The shock absorbers 16 can also attach to the heat sink in any number of other ways.

The drive mounting system 10 can further include additional features such one or more PCBs 12 and one or more fans 14 (FIGS. 4-4A). In the illustrated embodiment, two PCBs and one fan are included. It will be understood that some or all of the PCBs and fans can be positioned in the enclosure separately from the drive mounting system 10. As has been mentioned, some embodiments are passive cooling systems and do not include a fan.

In some embodiments, the heat sink 50 of the drive mounting system 10 can be thermally connected to the enclosure. For example, as will be described in more detail below, a thermal pad 52 can be provided configured for contact with both the enclosure and the heat sink.

In some embodiments, a drive mounting system 10 can include one or more heat sinks, one or more disk drives, and one or more shock absorbers. The one or more drive can be directly attached to the one or more heat sink and the one or more shock absorber is directly connected to the one or more heat sink. One or more thermal conductor can be thermally connected to the one or more heat sink and configured to transfer heat from the one or more heat sink to an enclosure. The drive mounting system 10 can be part of a storage drive. The drive mounting system 10 may further include one or more PCB and/or fan.

In some embodiments a storage drive can comprise two heat sinks and two HDDs with four shock absorbers. The heats sinks can serve as mounting structures for the HDDs. A thermal pad can be positioned on each of the two heat sinks. A PCB can be connected to the heat sinks with a fan connected to the PCB. The fan can be positioned to direct air flow between the two HDDs.

Referring now to FIGS. 5A and 5B, a heat sink 50 can be seen in greater detail. The heat sink 50 can include one or more fins 54. In the illustrated embodiment the heat sink 50 has three fins 54. The one or more fins 54 can extend from a base 56. As illustrated the fins extend perpendicular to the base, though it will be understood that they can extend at other angles.

The heat sink 50 can also include a number of mounting holes 58. The mounting holes 58 can be used to mount a drive 20, PCB 12, or other device to the heat sink 50. The mounting holes 58 can be in the fins and/or base. As shown, the heat sink 50 has two pairs of mounting holes 58 on the base 56 and one mounting hole 58 in the fin 54 at top. In this embodiment, the two pairs of mounting holes on the base can be used to attach up to two drives to the heat sink and the mounting hole on the fin can be used to connect a PCB to the heat sink. It will be understood that any drive, PCB, or other device can be connected to the heat sink in other ways such as with adhesive, snapfit, friction fit, etc.

The heat sink can define a number of mounting surfaces 59 at which the drive, PCB, or other device can contact the heat sink. Having the drive, PCB, or other device in direct contact can allow the heat sink to draw heat from the drive, PCB, or other device to thereby help dissipate that heat. A fan can also be used to help dissipate heat. The heat sink can beneficially reduce the size of fan needed and/or the frequency of the fan turning on to cool the various components, among other benefits. As has been mentioned, the fan can be a significant draw on the power. The heat sink can also increase the number and/or size of drives positioned in close relationship within a size efficient enclosure, including for portable devices.

In some embodiments, the heat sink 50 of the drive mounting system 10 can be thermally connected to the enclosure. For example, a thermal pad 52 (FIG. 6) can be provided that is configured for contact with both the enclosure and the heat sink. The thermal pad 52 is preferably a thermally conductive elastomer. The thermal pad can be used to conduct heat from the heat sink to the enclosure. In some embodiments, one or more parts of the enclosure are made of metal, include metallic particles, or are otherwise thermally conductive. The thermal pad 52 can transfer heat from the heat sink to the enclosure. The enclosure can then experience convection cooling. The system can also include a fan to provide for internal convection cooling as well.

The thermal pad can be compliant so as to also provide shock absorption and/or so that the heat sink is not rigidly coupled to the enclosure. In other embodiments, that thermal connection can be provided by thermal grease, conductive filler, etc. Preferably, the source of thermal conduction between the heat sink and the enclosure either provides some shock absorption or has minimal impact on the functioning of the shock absorbers 16. For example, the thermal pad can be softer than the shock absorbers. This flexibility can also be useful to help prevent bulging of the lid of the enclosure.

The thermal pad can provide a thermally conductive interface. The pad can also be compliant. Viscoelastic compliance of the thermal pad when attached to the heat sink with shock mounts can aid with shock and vibration isolation to the subassembly 22.

In some embodiments, at least one of the mating members (here the top member 40) is metal, contains metal, thermally conductive plastic, or is otherwise thermally conductive. Preferably the majority of the enclosure is made of metal, contains metal, or is otherwise thermally conductive. In some embodiments, one, two, three, four, or more sides of the enclosure are made of metal, contain metal, or are otherwise thermally conductive.

The heat sink 50 can also include a number of grooves 60 in a surface of the heat sink. As illustrated the grooves 60 are on a top surface of the heat sink 50. The grooves 60 can be used to increase the surface area of the heat sink 50. Looking to FIG. 6 it can be seen that the thermal pad 52 can be forced into the space created by the grooves 60. This can increase the amount of surface contact between the thermal pad 52 and the heat sink 50.

In some embodiment, a heat sink can comprise a plurality of ridges extending along a surface of a fin with a plurality of spaces or grooves between adjacent ridges. The thermal pad can be positioned along this surface such that when fully assembled, the thermal pad is on at least some of the plurality of ridges and in at least some of the plurality of spaces due to the force of the enclosure on the thermal pad, thereby increasing the surface area of contact between the thermal pad and the heat sink.

Applicants' research has found that this increased surface area can increase heat transfer. The thermal pad used on a heat sink with grooves has been found to provide an additional 1-2 degrees Celsius (° C.) of cooling compared to a similar device under the same conditions without the grooves.

In some embodiments, it can be desirable for the thermal pad 52 to experience at least 10% compression when the storage drive is in the assembled condition. For example, this can help ensure a sufficient thermal connection between the heat sink, the thermal pad and the enclosure (here the lid). This can also help ensure that the thermal pad is positioned within the grooves on the heat sink. In some embodiments, the thermal pad 52 can be sized to experience a maximum of 15-20% compression. The load on the thermal pad can influence the pad's thermal impedance. In some embodiments, the thermal pad can be sized to experience between 10-20% compression when assembled. In other embodiments, it can be greater than 5%, 7%, 8%, 10%, or 12%, but less than any of 13%, 15%, 17%, 20%, 22% and 25%.

Looking at cross-sections of FIGS. 2 and 6, one embodiment of the heat sink 50 within an enclosure can be seen. It can be seen that the drives 20 and PCB 12 are sandwiched between two heat sinks 50. The drives 20 and PCB 12 are in direct contact with the heat sink such that heat can flow from the drives and PCB to the heat sink. Heat can then flow through the thermal pad from the heat sink to the lid of the enclosure 40.

In some embodiments, a heat sink can have a base having at least two mounting surfaces, each mounting surface configured for mounting each of at least two drives to the heat sink; and a plurality of fins extending generally perpendicularly from the base, at least one fin of the plurality of fins extending between two drives of the at least two drive. The two heat sinks can be positioned on opposite sides of the at least two drives. In some embodiments, at least one fin of the plurality of fins of each of the two heat sinks that extends between the two drives of the at least two drives, extends towards the respective fin of the other heat sink.

The size of the fins can be relatively short. This can allow for increased air flow between the drives. For example, one or more of the fins can be shorter than 10%, 11%, 12%, 15%, and 17% of an overall length a drive connected to the heat sink.

It will be understood that the devices connected to the heat sink 50 can be stacked in any number of different orders. As shown, two drives 20 are below a PCB 12. In other embodiments, a PCB can be below at least one drive. In some embodiments the components can be stacked in order of their temperature rating, such that the component with the highest rating is on top. For example, many drives are rated for use at up to 65° C., where many chips on a PCB may be rated for use at up to 80° C. Thus, the PCB can be on top. In some embodiments, the greatest heat generators can be on top. For example, a disk drive typically generates more heat than a PCB and more heat than other components that would be in a storage drive. Thus, the drives can be on top. It will be understood that the term "top" is a relative term and that a device may have feet on a side opposite the "top". In some embodiments, there is not a clearly defined top or bottom and/or the device can be configured for use in one of many different orientations.

As shown, a fin is positioned between each of the components on the heat sink. Each component can have a dedicated fin or can share fins. In some embodiment the heat sink does not have fins between each component.

Figure 7:
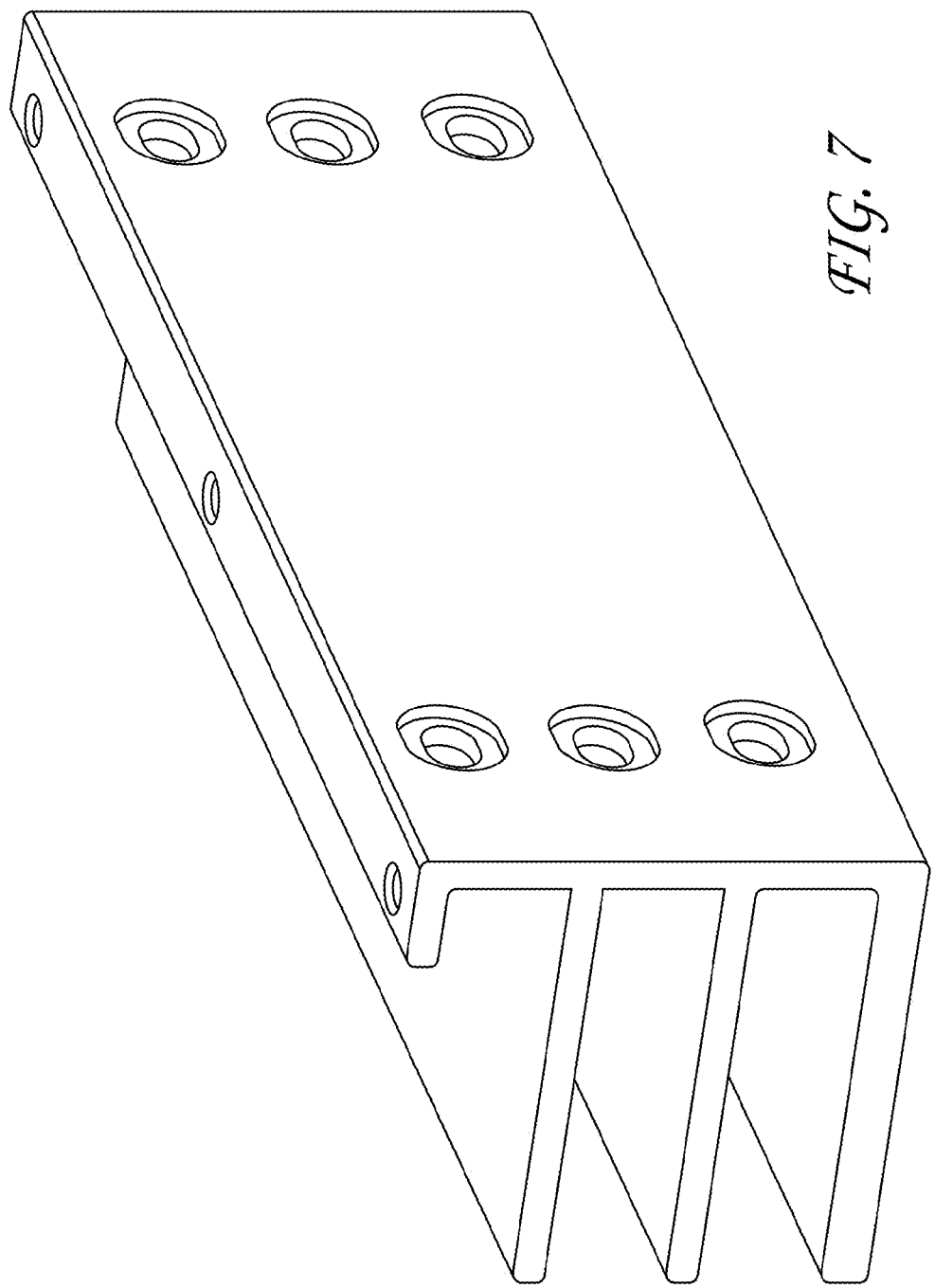
FIG. 7 shows another embodiment of heat sink.

FIG. 7 shows another embodiment of heat sink. This heat sink has four fins, three large fins and one shorter fin. It will be understood that any number and size of fins can be used. In the illustrated embodiment, up to three drives can be attached to the heat sink. A PCB can also be attached to the top of the heat sink.

According to some embodiments, a disk drive heat sink mounting structure can be provided with integrated shock mounts to promote passive and forced convection cooling. The heat sink design can allow for mounting of multiple disk drives, a controller PCB and a pair of shock mounts, among other things.

A drive mounting system may be employed to enhance cooling of components, such as the controller electronics, SSD, and multiple disk drives densely stacked inside an enclosure, and also providing shock and vibration isolation. In some embodiments, the drive mounting system can be used bus-powered devices, such as a THUNDERBOLT-powered devices and USB-powered devices.

In some embodiments, the heat sink can perform multiple functions, both structural and thermodynamic. It can be used as a heat dissipating (heat conducting medium) element and it can be used as the key mechanical mounting structure for storage drives, such as HDDs, and the required circuit boards. The storage drive of some embodiments preferably provides sufficient sway space around the disk drive subassembly for effective shock and vibration isolation, yet also provides a sufficiently effective heat conductive path between the heat sink and the outer enclosure.

According to some embodiments, a storage device can comprise at least two drives, first and second mating members that when engaged form an enclosure, two heat sinks for mounting the two drives within the enclosure, and a plurality of shock absorbers. Each heat sink can comprise a base having at least two mounting surfaces, each mounting surface configured for mounting each of the at least two drives to the heat sink; and a plurality of fins extending generally perpendicularly from the base, at least one fin of the plurality of fins extending between two drives of the at least two drives. Each of the shock absorbers can be connected to one of the two heat sinks and the enclosure to isolate the at least two drives from the enclosure. Each of the two heat sinks can be thermally connected to the enclosure and to the at least two drives such that heat from the at least two drives is transferred from the at least two drives to the heat sinks and then to the enclosure.

The storage device can further include two thermal pads where each thermal pad is in contact with one of the two heat sinks and the enclosure to thermally connect the respective heat sink to the enclosure. One of the plurality of fins of each of the two heat sinks can have a plurality of ridges extending along a surface of the fin with a plurality of spaces between adjacent ridges. The thermal pad can be positioned along said surface such that when fully assembled, the thermal pad is on at least some of the plurality of ridges and in at least some of the plurality of spaces due to the force of the enclosure on the thermal pad, thereby increasing the surface area of contact between the thermal pad and the heat sink.

The two heat sinks can be positioned on opposite sides of the at least two drives. Further, the at least one fin of the plurality of fins of each of the two heat sinks that extends between the two drives of the at least two drives can extend towards the respective fin of the other heat sink. The at least one fin of the plurality of fins of each of the two heat sinks can be shorter than 10%, 12%, or 15% of an overall length of either of the two drives of the at least two drives, thereby allowing airflow between the two drives of the at least two drives.

In some embodiments, a storage device can comprise at least two drives, first and second mating members that when engaged form an enclosure, a heat sink for mounting the at least two drives within the enclosure, and a plurality of shock absorbers connected to the heat sink and the enclosure to isolate the at least two drives from the enclosure. The heat sink can include a base having at least two mounting surfaces, each mounting surface configured for mounting each drive of the at least two drives to the heat sink; and a fin extending generally perpendicularly from the base and between two drives of the at least two drives. The heat sink can be thermally connected to the enclosure and to the at least two drives such that heat from the at least two drives is transferred from the drives to the heat sink and then to the enclosure.

The storage device may include a second heat sink, where each heat sink is positioned on opposite sides of the at least two drives. A thermal pad can be in contact with the heat sink and the enclosure to thermally connect the heat sink to the enclosure. The heat sink can further comprise a plurality of ridges extending along a surface of the fin with a plurality of spaces between adjacent ridges, the thermal pad positioned along said surface such that when fully assembled, the thermal pad is on at least some of the plurality of ridges and in at least some of the plurality of spaces due to the force of the enclosure on the thermal pad, thereby increasing the surface area of contact between the thermal pad and the heat sink.

According to some embodiments, a heat sink for stacking multiple drives can comprise a base having first and second mounting surfaces, one surface for mounting each of two drives to the heat sink; and first, second and third fins extending generally perpendicularly from the base. The first and second fins can be spaced to allow a printed circuit board (PCB) to be mounted between them on the heat sink. The second and third fins can be spaced to allow a first drive to be mounted between them on the heat sink at the first mounting surface, and a second drive to be mounted adjacent only the third fin at the second mounting surface. The first fin can comprise a plurality of ridges extending along a surface of the first fin with a plurality of spaces between adjacent ridges.

A thermal pad can be positioned on at least some of the plurality of ridges and in at least some of the plurality of spaces.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A storage device comprising:
   at least one drive;
   first and second mating members forming an enclosure; and
   two heat sinks mounting the drive within the enclosure, each heat sink comprising:
      a base having a mounting surface mounting the drive to the heat sink; and
      a plurality of fins extending generally perpendicularly from the base, at least one fin of the plurality of fins extending along a side of the drive, wherein the extent of the at least one fin along the side of the drive is generally perpendicular to the mounting surface, wherein the plurality of fins extend from the base in the same direction of the extent of the at least one fin along the side of the drive,
   wherein the two heat sinks are positioned on opposite sides of the drive, and
   wherein each of the two heat sinks is thermally connected to the enclosure and to the drive such that heat from the drive is transferred from the drive to the heat sinks and then to the enclosure.

2. The storage device of claim 1, further comprising two thermal pads, each thermal pad in contact with one of the two heat sinks and the enclosure to thermally connect the respective heat sink to the enclosure.

3. The storage device of claim 2, wherein one of the plurality of fins of each of the two heat sinks comprises a plurality of ridges extending along a surface of the fin with a plurality of spaces between adjacent ridges, the respective thermal pad positioned along said surface such that the thermal pad is on at least some of the plurality of ridges and in at least some of the plurality of spaces due to the force of the enclosure on the thermal pad, thereby increasing the surface area of contact between the thermal pad and the heat sink.

4. The storage device of claim 1, wherein the at least one fin of one of the two heat sinks extends toward the respective at least one fin of the other heat sink along the side of the drive.

5. The storage device of claim 4, wherein the at least one fin of the plurality of fins of each of the two heat sinks is shorter than 15% of an overall length of the drive, thereby allowing airflow along the drive.

6. The storage device of claim 1, wherein each fin of the plurality of fins of each of the two heat sinks is shorter than 15% of an overall length of the drive along the side of the drive, thereby allowing airflow along the drive.

7. The storage device of claim 1, wherein the plurality of fins on each heat sink comprises two fins on each of the two heat sinks.

8. The storage device of claim 7, further comprising a printed circuit board (PCB) mounted adjacent the drive on the two heat sinks and between facing surfaces of the two fins on each of the two heat sinks.

9. The storage device of claim 8, wherein the plurality of fins on each heat sink comprises three fins on each of the two heat sinks, the drive mounted on the two heat sinks with the PCB mounted adjacent the side of the drive, one of the three fins extending along the drive on an other side of the drive opposite the side of the drive with the drive positioned between two of the three fins on each of two heat sinks.

10. The storage device of claim 1, wherein the drive is not in direct contact with the enclosure.

11. The storage device of claim 1, wherein each of the mounting surfaces of the two heat sinks comprises a pair of mounting holes for mounting the drive to the heat sink.

12. The storage device of claim 1, wherein the at least one fin is in direct contact with the drive along the side of the drive.

13. A storage device comprising:
   first and second mating members configured to form an enclosure; and
   a heat sink for mounting a drive within the enclosure, the heat sink comprising:
      a base having a mounting surface for mounting the drive to the heat sink and a substantially planar surface opposite the mounting surface, the substantially planar surface having a surface area greater than a surface area of the mounting surface; and
      a fin extending generally perpendicularly from the mounting surface of the base and along the drive,
   wherein the heat sink is configured to thermally connect to the enclosure and to the drive to transfer heat from the drive to the heat sink and then to the enclosure.

14. The storage device of claim 13, further comprising a second heat sink, wherein each heat sink is configured to be positioned on opposite sides of the drive.

15. The storage device of claim 13, further comprising a thermal pad configured to be in contact with the heat sink and the enclosure to thermally connect the heat sink to the enclosure.

16. The storage device of claim 15, wherein the heat sink further comprises a plurality of ridges extending along a surface of the fin with a plurality of spaces between adjacent ridges, the thermal pad configured to be positioned along said surface such that when fully assembled, the thermal pad is on at least some of the plurality of ridges and in at least some of the plurality of spaces due to the force of the enclosure on the thermal pad, thereby increasing the surface area of contact between the thermal pad and the heat sink.

17. The storage device of claim 16, wherein the heat sink further comprises a second fin extending generally perpendicularly from the base, wherein the plurality of ridges are on the second fin.

18. The storage device of claim 13, wherein the base has a longer extent in at least one dimension relative to the fin.

19. The storage device of claim 13, wherein the substantially planar surface forms a side of the heat sink in substantially the entirety of the side.

20. A heat sink for a drive, the heat sink comprising:
   a base having:
      a mounting surface for rigidly mounting a drive to the heat sink via the mounting surface and one or more screws; and
      an other surface opposite the mounting surface; and
   a fin extending generally perpendicularly from the base, wherein the fin is configured to extend along a first surface of the drive with the mounting surface configured to mount the drive at a second surface of the drive, and wherein the other surface does not have fins.

21. The heat sink of claim 20, wherein a thermal pad is configured to be in thermal communication with the base to dissipate heat from the heat sink.

22. The heat sink of claim 20, further comprising an other fin extending generally perpendicularly from the base, wherein the fin and the other fin are spaced to allow the drive to be mounted between the fin and the other fin on the heat sink at the mounting surface.

23. The heat sink of claim 20, wherein the fin is shorter than an overall length of the drive, wherein an extent of the fin is along a side of the drive, and wherein the overall length of the drive is along the extent of the fin , thereby allowing airflow by the drive.

24. The heat sink of claim 20, wherein the fin and base are monolithic.

25. A storage device comprising:
   first and second mating means configured to form an enclosure; and
   a heat sink means for mounting a drive within the enclosure, the heat sink means comprising:
      a base means having a mounting surface for mounting the drive to the heat sink means and a substantially planar surface opposite the mounting surface, the substantially planar surface having a surface area greater than a surface area of the mounting surface; and
      a fin means extending generally perpendicularly from the mounting surface of the base means and along the drive,
   wherein the heat sink means is configured to thermally connect to the enclosure and to the drive to transfer heat from the drive to the heat sink means and then to the enclosure.

* * * * *